United States Patent [19]
Park

[11] Patent Number: 5,909,133
[45] Date of Patent: *Jun. 1, 1999

[54] CLOCK SIGNAL MODELING CIRCUIT

[75] Inventor: Sung Man Park, Seoul, Rep. of Korea

[73] Assignee: LG Semicon Co., Ltd., Cheongu, Rep. of Korea

[*] Notice: This patent is subject to a terminal disclaimer.

[21] Appl. No.: 08/927,812

[22] Filed: Sep. 11, 1997

Related U.S. Application Data

[62] Division of application No. 08/587,745, Jan. 19, 1996, Pat. No. 5,708,382.

[30] Foreign Application Priority Data

Dec. 18, 1995 [KR] Rep. of Korea .................. 1995/51427

[51] Int. Cl.⁶ .................................................. H03K 5/14
[52] U.S. Cl. .......................... 327/277; 327/152; 327/269
[58] Field of Search .................................. 327/141, 152, 327/153, 161, 166, 176, 269, 270, 271, 276, 277, 284, 293

[56] References Cited

U.S. PATENT DOCUMENTS

| | | | |
|---|---|---|---|
| 3,248,657 | 4/1966 | Tureki | 327/269 |
| 3,588,707 | 6/1971 | Manship | 327/269 |
| 3,619,669 | 11/1971 | Wheeler | 327/277 |
| 3,624,519 | 11/1971 | Beydler | 327/277 |
| 4,443,766 | 4/1984 | Belton, Jr. | 327/271 |
| 4,618,787 | 10/1986 | Jacksier et al. | 327/277 |
| 4,675,612 | 6/1987 | Adams et al. | 327/152 |
| 4,677,499 | 6/1987 | Shirota et al. | 327/271 |
| 4,713,621 | 12/1987 | Nakamura et al. | 327/269 |
| 5,451,894 | 9/1995 | Guo | 327/277 |
| 5,465,076 | 11/1995 | Yamauchi et al. | 327/277 |
| 5,537,069 | 7/1996 | Volk | 327/152 |

*Primary Examiner*—My-Trang Nu Ton
*Attorney, Agent, or Firm*—Fleshner & Kim

[57] ABSTRACT

An improved clock signal modeling circuit capable of more quickly generating an internal clock signal in an external clock signal without using a phase locked loop and a delay locked loop, which includes a delay unit for receiving an external clock signal and for outputting a delay clock sinal; a sampling unit for receiving the delay clock signal and for sampling in accordance with an external clock signal; a comparing unit for receiving the output of the sampling unit and for sequentially comparing the output; and an output unit for receiving the delay clock signal outputted from the delay unit and for outputting an internal clock signal in accordance with an output signal of the comparing unit and an externally applied switching signal.

18 Claims, 4 Drawing Sheets

FIG. 2A CLOCK_IN
FIG. 2B CLOCK_D1
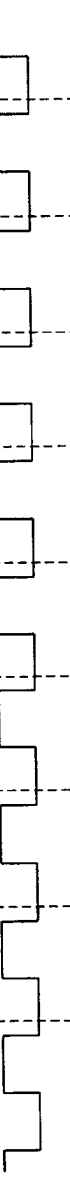
FIG. 2C CLOCK_D2
FIG. 2D CLOCK_D3
FIG. 2E CLOCK_D4
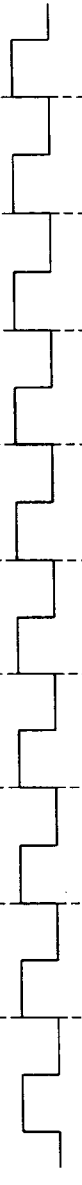
FIG. 2F CLOCK_D5
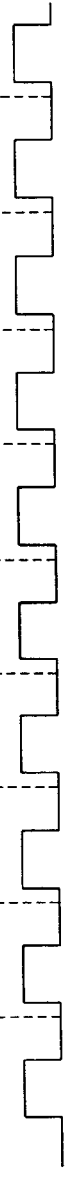
FIG. 2G CLOCK_D6
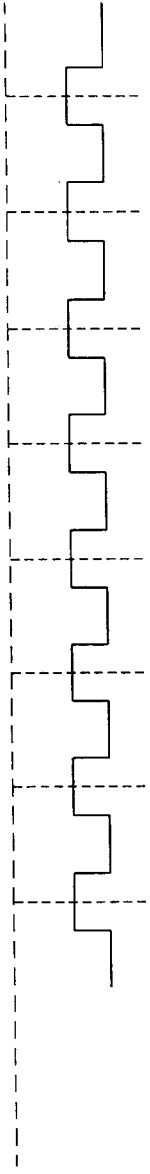
FIG. 2H CLOCK_OUT

CLOCK SIGNAL MODELING CIRCUIT

This application is a divisional of application Ser. No. 08/587,745 filed Jan. 19, 1996 U.S. Pat. No. 5,708,382.

BACKGROUND OF THE INVENTION

1. Field of the Invention

The present invention relates to a clock signal modeling circuit, and particularly to an improved clock signal modeling circuit capable of more quickly generating an internal clock signal from an external clock signal without using a phase locked loop (PLL) and a delay locked loop (DLL).

2. Description of the Conventional Art

Recently, memory chips which operate at a high speed have been developed. However, in order that a certain circuit may generate an internal clock signal, it is necessary to receive an external clock signal and have a certain delay process. In this regard, since the delay process has its limit, there is a certain limit to reduce the clock access time until the external clock signal is received and the data stored in a memory is outputted.

Therefore, generally, a PLL or a DLL are used in order to reduce the clock access time, so that delay between the external clock signal and the internal clock signal can be reduced, and it is possible to more quickly generate the internal clock signal than that of the external clock signal.

However, a method of reducing a clock access time using the PLL and DLL requires hundreds of clock cycles, and even in a stand-by state the PLL and DLL should be operated, so that more current consumption is disadvantageously required.

In addition, if the PLL or DLL is turned off in order to reduce the current consumption in a self refresh operation which does not access a chip, in order to access the chip again, it is required to stop the operation of the self refresh operation, and the PLL and DLL should be operated, so that it is difficult to lock an external clock signal and an internal clock signal for hundreds of cycles.

SUMMARY OF THE INVENTION

Accordingly, it is an object of the present invention to provide a clock signal modeling circuit, which overcomes the problems encountered in a conventional clock signal modeling circuit.

It is another object of the present invention to provide an improved clock signal modeling circuit capable of more quickly generating an internal clock signal in an external clock signal without using a phase locked loop and a delay locked loop.

To achieve the above objects, there is provided a clock signal modeling circuit, which includes a delay unit for receiving an external clock signal and for outputting a delay clock signal; a sampling unit for receiving the delay clock signal and for sampling in accordance with an external clock signal; a comparing unit for receiving the output of the sampling unit and for sequentially comparing the output; and an output unit for receiving the delay clock signal outputted from the delay unit and for outputting an internal clock signal in accordance with an output signal of the comparing unit and an externally applied switching signal.

BRIEF DESCRIPTION OF THE DRAWINGS

FIGS. 2A–2H are diagrams showing a timing of each element of FIG. 1 according to the present invention.

DETAILED DESCRIPTION OF THE INVENTION

Figure 1:
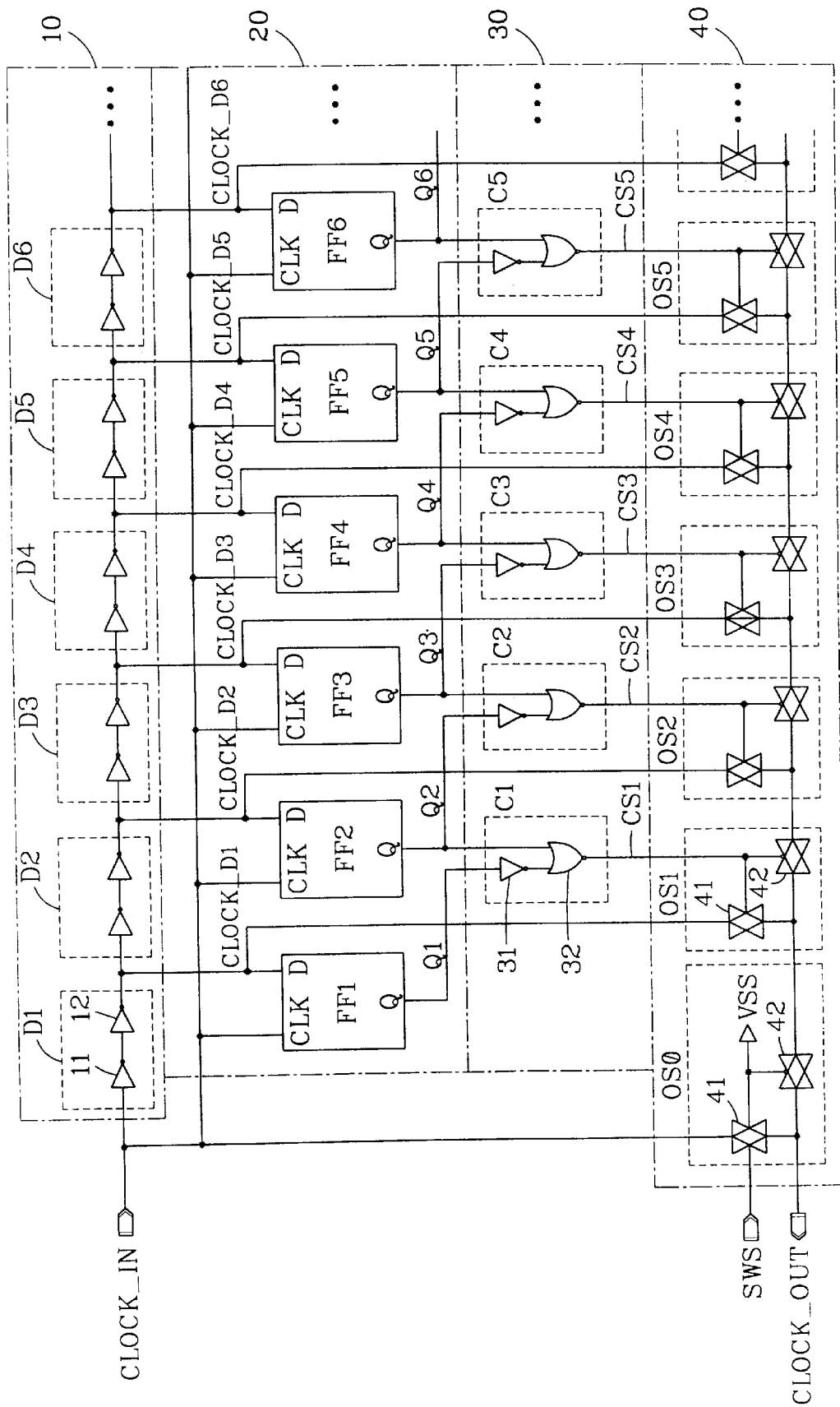
FIG. 1 is a circuit diagram of a clock signal modeling circuit of a first embodiment according to the present invention.

FIG. 1 shows a clock signal modeling circuit of a first embodiment according to the present invention, which includes a delay unit 10 for receiving an external clock signal CLK_IN and for outputting delay clock signals CLK_D1~CLK_DN, a sampling unit 20 for receiving the delay clock signals CLK_D1~CLK_DN and for sampling in accordance with an external clock signal CLK_IN, a comparing unit 30 for receiving the output of the sampling unit 20 and for sequentially comparing, and an output unit 40 for receiving the delay clock signals CLK_D1~CLK_DN and for outputting an internal clock signal in accordance with an output signal of the comparing unit 30.

The delay unit 10 includes a plurality of delay terminals $D1~Dn$ each consisting of two inverters I1 and I2, and the sampling unit 20 includes flipflops FF1~FFn each receiving the delay clock signal outputted from the delay unit and sampling in accordance with an external clock signal CLK_IN and outputting a non-inverted output signal Qn, where n denotes 1, 2, 3, . . . , n.

The comparing unit 30 includes comparing units C1~Cn each comparing unit Cn including an inverter 31 for receiving an output signal Qn of the flipflop FFn and for outputting an inverted value and a NOR gate 32 for NORing the output of the inverter 31 and the output of the flipflop FFn+1.

The output unit 40 includes output selection unit OS0~OSn each including a transmission gate 41 for receiving an external clock signal CLK_IN and for outputting in accordance with a switching signal SWS and a transmission gate 42 connected to the transmission gate 41 in parallel and always turned on by a ground voltage. In addition, each output selection unit OSn includes the transmission gate 41 for transmitting a delay clock signal CLK_Dn outputted from the delay terminal Dn in accordance with a comparing signal CSn outputted from the comparing unit Cn and the transmission gate 42 connected to the transmission gate in parallel and become conductive in accordance with a comparing signal CSn outputted from the comparing unit Cn.

The operation of the clock signal modeling circuit of the first embodiment according to the present invention will now be explained with reference to the accompanying drawings.

To begin with, when an external clock signal CLK_IN is inputted, each of delay terminals D1~Dn delays the external clock signal CLK_IN and outputs the delay clock signals CLK_D1~CLK-Dn to the sampling unit 20 and the output unit 40.

Thereafter, the flipflops FF1~FFn of the sampling unit 20 samples the delay clock signals CLK_D1~CLK_Dn at an increasing edge of the external clock signal CLK_IN and outputs noninverted output signals Q1~Qn, and the comparing units C1~Cn of the comparing unit 30 sequentially compare each pair of consecutive output signals Q1~Qn and outputs comparing signals CS1~CSn.

Therefore, the output unit 40 outputs one clock signal as an internal clock signal among the delay clock signals CLK_D1~CLK_Dn outputted from the delay terminals D1~Dn.

That is, as shown in FIG. 2A, when the external clock signal CLK_IN is inputted, the delay terminals D1~Dn delay the external clock signal CLK_IN in cooperation with two inverters I1 and I2, and outputs delay clock signals CLK_D1~CLK_Dn as shown in FIGS. 2B through 2G.

Thereafter, the flipflop FF1 of the sampling unit 20 receives the delay clock signal CLK_D1 and samples the signal at an increasing edge of the external clock signal CLK_IN and outputs a low level signal Q1, and the flipflop FF2 samples the delay clock signal CLK_D2 and outputs a low level signal Q2.

In addition, the flipflop FF3 samples the delay clock signal CLK_D3 at an increasing edge of the external clock signal CLK_In and outputs a high level signal Q3, and the flipflop FF4 samples the delay clock signal CLK_D4 and outputs a high level signal Q4, and the fifth and sixth flipflops FF5 and FF6 output low level signals Q5 and Q6 to the comparing unit 30, respectively, in the above-mentioned method.

In addition, the operations of the flipflops FF7~FFn are performed in the above-explained method.

Thereafter, the low level signal Q1 outputted from the flipflop FF1 is inverted by an inverter 31 of the comparing unit C1, and the NOR-gate 32 NORs, the inverted signal and the low level signal Q2 outputted from the flipflop FF2 and outputs a low level comparing signal CS1.

In addition, the comparing unit C2 logically receives a low level signal Q2 outputted from the flipflop FF2 and a high level signal Q3 outputted from the flipflop FF3 and outputs a low level comparing signal CS2, and the comparing unit C3 logically receives a high level signal Q3 outputted from the flipflop FF3 and a high level signal Q4 outputted from the flipflop FF4 and outputs a low level comparing signal CS3, and the comparing unit C4 logically receives a high level signal Q4 outputted from the flipflop FF4 and a low level signal Q5 outputted from the flipflop FF5 and outputs a high level comparing signal CS4, and the remaining comparing units C5~Cn are performed in the above-mentioned method.

At this time, the transmission gate 41 of the output selection units OS1~OS3 is turned off in accordance with low level comparing signals CS1~CS3 outputted from the comparing units C1~C3, and the transmission gate 42 is turned on, and the transmission gate 42 of the output selection unit OS4 is turned off in accordance with a high level comparing signal CS4 outputted from the comparing unit C4, and the transmission gate 41 is turned ON.

Therefore, since the delay clock signal CLK_D4 outputted from the delay terminal D4 of the delay unit 10 is outputted to the output terminal CLK_OUT through the transmission gate 41 of output selection unit OS4, an internal clock signal CLK_OUT, which is slightly faster than that of the external clock signal CLK_IN, can be obtained as shown in FIG. 2H.

When using the external clock signal CLK_IN as an internal clock signal, a high level switching signal SWS is inputted into the output selection unit OS0, and the transmission gate 41 of output selection unit OS0 is turned on, and an external clock signal CLK_IN is outputted to the output terminal CLK_OUT, when one clock signal of the delay clock signal CLK_D1~CLK_D3 outputted from the delay terminals D1~D3 is used as an internal clock signal, the inputted external clock signal CLK_IN is varied, and the comparing signals CS1~CS3 outputted from the comparing units C1~Cn are adjusted, and the delay clock signals CLK_D1~CLK_D3 are selectively outputted.

Figure 3:
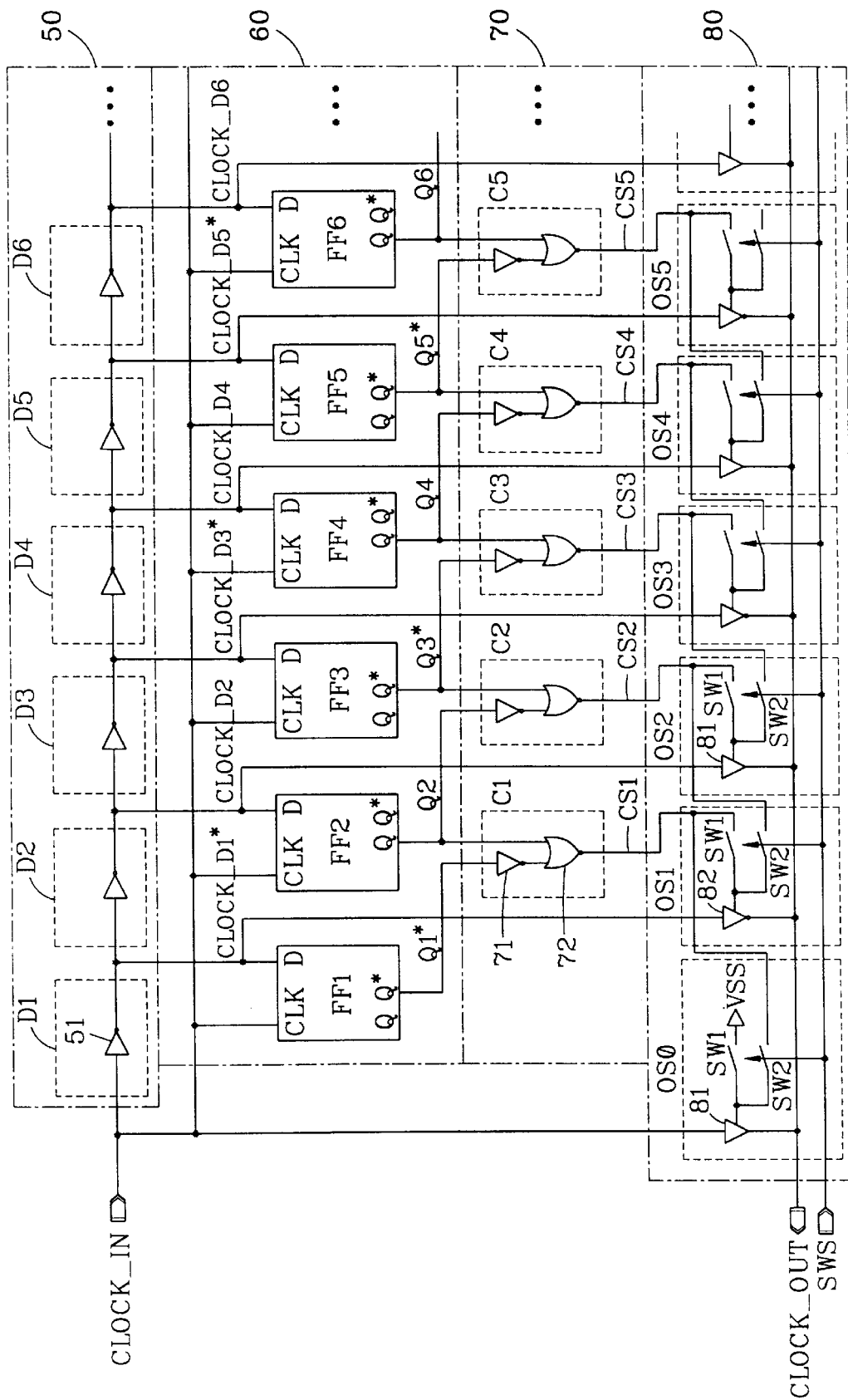
FIG. 3 is a circuit diagram of a clock signal modeling circuit of a second embodiment according to the present invention.

FIG. 3 shows a clock signal modeling circuit of a second embodiment according to the present invention, which includes a delay unit 50 for delaying an external clock signal CLK_IN for a predetermined time and for outputting delayed clock signals CLK_D1~CLK_Dn, a sampling unit 60 for receiving the delay clock signals CLK_D1~CLK_Dn and for sampling in accordance with an external clock signal CLK_IN, a comparing unit 70 for receiving and comparing outputs Q1~Qn of the sampling unit 60 and for outputting comparing signals CS1[18] CSn, and an output unit 80 for receiving delay clock signals CLK_D1~CLK_Dn outputted from the delay unit 50 and for outputting comparing signals CS1~CSn of the comparing unit 70 and an internal clock signal in accordance with an external switching signal SWS.

The delay unit 50 includes a plurality of delay terminals Dn each consisting of one inverter 51, and the sampling unit 60 includes a plurality of flipflops FF1~FFn each receiving a delay clock signal CLK_Dn outputted from the delay unit Dn, sampling the external clock signal CLK_IN at an increasing edge, inverting the output from an odd number flipflop $FF_{2n-1}$, and noninverting the output from an even number flipflop $FF_{2n}$.

In addition, the construction of the comparing unit 70 is the same as the comparing unit 30 as shown in FIG. 1. The output unit 80 includes output selection units OS0~OSn. The output selection unit OS0 includes a buffer 81 for buffering an external clock signal CLK_IN, a switch SW1 connected to an output enable terminal and a ground voltage Vss for switching in accordance with an external control signal, and a switch SW2 connected to an output enable terminal of the buffer 81 and the output terminal of the comparing unit C1 for switching in accordance with an external control signal.

In addition, the output selection units OS1~OSn includes an inverter 82 for inverting the output of the delay terminal $D_{2n-1}$, and a switch SW1 connected to the output enable terminal of the inverter 82 and the output terminal of the comparing unit $C_{2n-1}$, the output selection unit $OS_{2n-1}$ having a switch SW2 connected to the output enable terminal of the inverter 82 and the output terminal of the comparing unit $C_{2n}$ for outputting a comparing signal $CS_{2n}$ in accordance with a switching signal SWS, a buffer 81 for buffering the output of the delay unit $D_{2n}$, a switch SW1 connected to the output enable terminal of the buffer 81 and the output terminal of the comparing unit $C_{2n}$ for outputting a comparing signal $CS_{2n}$ in accordance with a switching signal SWS and an output selection unit $OS_{2n}$ having a switch SW2 connected to the output enable terminal of the buffer 81 and the output terminal of the comparing unit $C_{2n+1}$, in accordance with a switching signal SWS.

The operation of the clock signal molding circuit of the second embodiment according to the present invention will now be explained with reference to the accompanying drawings.

To begin with, when an external clock signal CLK_IN is inputted, the delay terminals D1~Dn of the delay unit 50 delays the external clock signal CLK_IN and outputs the delay clock signal CLK_$D_{2n-1}$ and the delay clock signal CLK_$D_{2n}$ to the sampling unit 60 and the output unit 80.

Thereafter, the flipflops FF1~FFn of the sampling unit 60 receive the delay clock signal/CLK_$D_{2n-1}$ and the delay clock signal CLK_$D_{2n}$ and sample at an increasing edge of the external clock signal CLK_IN and output the output signal/$Q_{2n-1}$ and the output signal $Q_{2n}$ to the inverted terminal/Q and the noninverted terminal Q, and the comparing units C1~Cn of the comparing unit 70 sequentially compare the output signal/$Q_{2n-1}$ and the output signal $Q_{2n}$.

Therefore, the output selection units OS1~OSn of the output unit 80 receive the delay clock signal/CLK_$D_{2n-1}$ and the delay clock signal/CLK_$D_{2n}$ outputted from the delay terminals D1~Dn and output a clock signal as an internal clock signal in accordance with a comparing signal $CS_{2n-1}$ and a comparing signal $CS_{2n}$ outputted from the switches SW1 and SW2.

That is, when a high level comparing signal CS2 is outputted from the comparing unit C2, and when the switch SW1 of the output selection unit OS2 is selected in accordance with a switching signal SWS, the output of the buffer 81 is enabled, and the delay clock signal CLK_D2 outputted from the delay terminal D2 is selected by the switch SW2 of the output selection unit OS1, and the output of the inverter 82 is enabled in accordance with a high level comparing signal C2, and the delay clock signal/CLK_D1 outputted from the delay terminal D1 is inverted by the inverter 82 and outputted to the output terminal CLK_OUT.

In addition, in case that the external clock signal CLK_IN is directly outputted to the internal clock signal, when a high level comparing signal CS1 is outputted from the comparing unit C1, the switch SW2 of the output selection unit OS0 is turned on the switching signal SWS, and the output of the buffer 81 is enabled, and the external clock signal CLK_IN is outputted to the output terminal CLK_OUT through the buffer 81.

Therefore, in the second embodiment of the present invention, when high level comparing signals CS1~CSn are outputted from the comparing units C1~Cn of the comparing unit 70, the switches SW1 and SW2 of the output selection units OS0~OSn are controlled, and the delay clock signals CLK_D1~CLK_Dn outputted slower or quicker than that of the external clock signal CLK_IN can be outputted.

Figure 4:
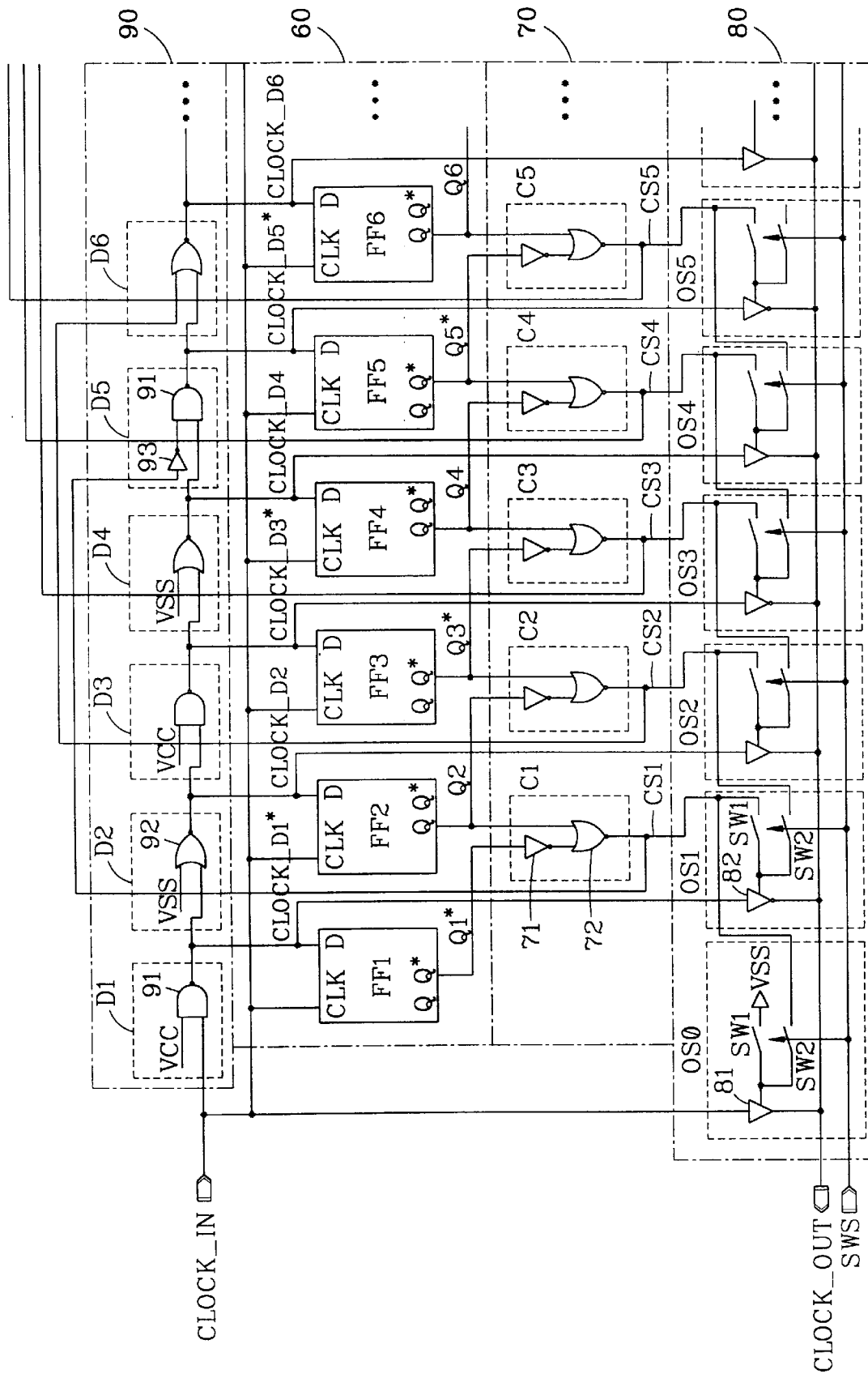
FIG. 4 is a circuit diagram of a clock signal modeling circuit of a third embodiment according to the present invention.

FIG. 4 shows a clock signal modeling circuit of a third embodiment according to the present invention. Here, the delay unit 50 of the second embodiment is substituted by a delay unit 90 capable of stopping an operation of a certain delay terminal.

As shown therein, there is provided the delay unit 90 including a plurality of odd delay terminals $D_{2n-1}$ each consisting of a NAND-gate, a plurality of even delay terminals $D_{2n}$ each consisting of a NOR-gate. The odd delay terminals D1 and D3 of the delay terminals D1~D4 receives a voltage Vcc through one end thereof, and the even delay terminals D2 and D4 receive a ground voltage Vss through one end thereof, and the odd number delay terminal of the delay terminals D5~Dn is connected to the inverter 93 converting the comparing signal $CS_{2n-1}$ of the comparing unit 30, and the even number delay terminals receive the comparing signal $CS_{2n}$ of the comparing unit through one end thereof.

The operation of the third embodiment according to the present invention will now be explained with reference to the accompanying drawings.

To begin with, when an external clock signal CLK_IN is inputted, the delay terminals of the delay unit 90 delay an external clock signal CLK_IN through the NAND-gate 91 and the NOR-gate 92 and output the delay clock signals/CLK_$D_{2n-1}$, CLK_$D_{2n}$, . . . to the sampling unit 60 and the output unit 80, respectively.

Thereafter, the flipflops FF1~FFn of the sampling unit 60 receive the delay clock signals/CLK_$D_{2n-1}$, CLK_$D_{2n}$, . . . and sample at and increasing edge of the external clock signal CLK_IN and output the output signals/$Q_{2n-1}$ and $Q_{2n}$, an the comparing units C1~Cn of the comparing unit 70 sequentially compare the output signal/$Q_{2n-1}$ and the output signal $Q_{2n}$ and outputs the comparing signals CS1~CSn to the output unit 80 and the delay terminals D5~Dn, respectively.

Therefore, the output unit 80 receives the delay clock signals/CLK_$D_{2n-1}$, CLK_$D_{2n}$, . . . and outputs one clock signal as an internal clock signal in accordance with comparing signals CS1~CSn and a switching signal SWS of the comparing unit 70, and the delay terminals D5~Dn of the delay unit 90 outputs a high or low level signal in accordance with the comparing signals CS1~CSn outputted from the comparing unit 70.

That is, when a high level comparing signal CS1 is outputted from the comparing unit C1, the switch SW2 of the output selection unit OS0 or the switch SW1 of the output selection unit OS1 is turned on in accordance with a switching signal SWS, and a delay clock signal CLK_D1 outputted from the external clock signal CLK_IN or the delay terminal D1 is outputted as an internal clock signal, and the high level comparing signal CS1 outputted from the comparing unit C1 is inputted to the delay unit D5, and is inverted by the inverter 93 and is inputted to one terminal of the NAND-gate, and the output of the NAND-gate 91 is fixed as a high level.

At this time, the outputs of the delay terminals D2~D4 are effective in accordance with comparing signals CS2~CS4 and a switching signal SWS, and the delay terminals D5~Dn are fixed to a high level or a low level in accordance with the comparing signals CS2~CS5, so that it is possible to reduce electric power consumption when activating the delay terminals D5~Dn during an active operation.

As described above, the clock signal modeling circuit of the present invention is directed to outputting an internal clock signal which is outputted quicker or slower than an external clock signal as much as a certain delay terminal by delaying and sampling the external clock signal, sequentially comparing the sampled signal, and controlling the output of the comparing signal, so that it is possible to reduce electric power consumption during an active operation by fixing the delay terminal after a selected delay terminal to a high level or a low level.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A circuit comprising:
   a delay unit that receives an external signal and that outputs a plurality of delayed signals;
   a plurality of flip-flops, each flip-flop coupled to receive a corresponding delay signal from said delay unit to output a first signal such that said plurality of flip-flops output a plurality of first signals;
   a comparing unit coupled to receive the plurality of first signals and said comparing unit compares corresponding first signals from said plurality of flip-flops to output a plurality of second signals; and
   an output unit that receives the plurality of delayed signals and second signals and outputs one of the plurality of delayed signals as the output signal based on the plurality of second signals, wherein said output unit comprises a plurality of output selection units, each receiving a corresponding delay signal and a corresponding second signal.

2. The circuit of claim 1, wherein said delay unit includes a plurality of delay terminals each consisting of a first stage inverter and a second stage inverter.

3. The circuit of claim 1, wherein said delay unit includes a plurality of delay terminals of which each odd number delay terminal includes a NAND-gate and each even number delay terminal includes a NOR-gate.

4. The circuit of claim 3, wherein said delay terminals includes first and third delay terminals each receiving a first voltage one end thereof, second and fourth delay terminals each receiving a second voltage connected to one end thereof, and each odd number delay terminal from fifth through n-th delay terminals being connected to an inverter for inverting an odd number second signal of the comparing unit and each even number delay terminal from sixth through n-th delay terminals receiving an even number second signal of the comparing unit.

5. The circuit of claim 4, wherein an output of at least one of said delay terminals is fixed to a high level or a low level in accordance with said second signal of the comparing unit.

6. The circuit of claim 1, wherein said comparing unit includes a plurality of inverters for inverting the plurality of first signals and a plurality of logic gates, each logic gate performing a logical operation between a corresponding first signal and an output of a corresponding inverter.

7. The circuit of claim 1, wherein said output unit includes an output selection unit for directly outputting said external signal and a plurality of selection units for outputting said delay signal.

8. The circuit of claim 7, wherein each of said plurality of selection unit includes:

a first transmission gate for receiving said delay signal outputted from the delay unit and for transmitting in accordance with said second signal outputted from the comparing unit; and a second transmission gate connected with said first transmission gate in parallel and become conductive in accordance with said second signal outputted from the comparing unit.

9. The circuit of claim 7, wherein said output selection unit includes:

a buffer for buffering said external signal;

a first switch connected to an output enable terminal of said buffer and a ground voltage terminal and controlled in accordance with a switching signal; and a second switch connected to said output enable terminal of the buffer and the output terminal of the comparing unit, wherein said plurality of selection units includes;

a $2_{n-1}$th output selection unit having an inverter for buffering the delay signal, a first switch connected to the output enable terminal of said inverter and controlled in accordance with a switching signal, and a second switch connected to the output enable terminal of the inverter and the output terminal of the comparing unit; and a $2_n$nth output selection unit having a buffer for buffering the delay signal, a first switch connected to the output enable terminal of said buffer and controlled in accordance with a switching signal, and a second switch connected to the output enable terminal of the buffer and the output terminal of the comparing unit.

10. The circuit of claim 1, wherein said output unit outputs the external signal as the output signal in response to an external switching signal.

11. The circuit of claim 1, wherein said delay unit comprises a plurality of delay terminals, and each of said plurality of delay terminals comprises at least one inverter.

12. The circuit of claim 11, wherein said plurality of delay terminals comprises even delay terminals and odd delay terminals;

said plurality of flip-flops comprises even flip-flops and odd flip flops; and said comparing unit comprises even comparing units and odd comparing units.

13. The circuit of claim 12, wherein each of said even and odd comparing units sequentially compares first signals from adjacent odd and even flip-flops.

14. The circuit of claim 12, wherein each of said even delay terminals is a first logic gate and each of said odd delay terminals is a second logic gate different from said first logic gate.

15. The circuit of claim 14, wherein first and third delay terminals receive a first voltage and second and fourth delay terminals receive a second voltage different from the first voltage.

16. The circuit of claim 15, wherein each odd delay terminal from fifth through n-th delay terminals is coupled to receive a corresponding second signal outputted from a corresponding odd comparing unit; and each even delay terminal from sixth through n-th delay terminals are coupled to receive a corresponding second signal outputted from a corresponding even comparing unit.

17. The circuit of claim 1, wherein each output selection unit comprises:

a first transmission gate receiving the corresponding delay signal and transmitting the corresponding delay signal as the output signal in accordance with the corresponding second signal; and a second transmission gate coupled in parallel with said first transmission gate and becoming conductive in accordance with the corresponding second signal.

18. The circuit of claim 1, wherein each of said selection unit comprises:

an inverter receiving the corresponding delay signal;

a first switch coupled to an enable terminal of said inverter and responsive to a switching signal; and a second switch coupled to the enable terminal of said inverter and the corresponding second signal.

* * * * *